United States Patent [19]
Pietrobon

[11] Patent Number: 5,696,658
[45] Date of Patent: Dec. 9, 1997

[54] SHORT CIRCUIT PROTECTION CIRCUIT FOR A LOW-SIDE DRIVER CIRCUIT

[75] Inventor: Giovanni Pietrobon, Novi, Mich.

[73] Assignee: SGS-Thomson Microelectronics, Inc., Carrollton, Tex.

[21] Appl. No.: 539,732

[22] Filed: Oct. 5, 1995

[51] Int. Cl.[6] .................................. H02H 5/04
[52] U.S. Cl. ................... 361/31; 361/93; 361/100; 361/115
[58] Field of Search ................. 361/31, 93, 100, 361/115

[56] References Cited

U.S. PATENT DOCUMENTS

| | | | |
|---|---|---|---|
| 4,427,902 | 1/1984 | Hickman et al. | 367/270 |
| 5,432,665 | 7/1995 | Hopkins | 361/18 |

Primary Examiner—Jeffrey A. Gaffin
Assistant Examiner—Stephen Jackson
Attorney, Agent, or Firm—George E. Clark; Theodore E. Galanthay; Lisa K. Jorgenson

[57] ABSTRACT

A short circuit protection circuit which has a first short circuit protection circuit in parallel with a second short circuit protection circuit is disclosed. The first short circuit protection circuit includes a sense resistor and a comparator for detecting the short circuit, and a transistor and current source for turning off the low side driver when the short circuit is detected. The second short circuit protection circuit includes a current mirror, zener diode, transistor, and current source connected in series. The second short circuit protection circuit is in parallel with the first short circuit protection circuit. The second short circuit protection circuit accelerates the turn-off of the low-side driver with out affecting the stability of the circuit.

20 Claims, 1 Drawing Sheet

SHORT CIRCUIT PROTECTION CIRCUIT FOR A LOW-SIDE DRIVER CIRCUIT

BACKGROUND OF THE INVENTION

1. Field of the Invention

This invention relates to electronic circuits, and more specifically to short circuit protection circuits, and still more specifically to short circuit protection circuits used to protect a low-side driver transistor.

2. Description of the Relevant Art

The problem addressed by this invention is encountered in short circuit protection circuits which are used to protect power transistors such as the power transistors used to drive inductive loads. FIG. 1, for example, shows power transistors 9 and 10 driving the inductive load 14. Inductive load 14 is the schematic representation of stator coils, arranged in a wye configuration, of a DC motor. Power transistor 9 is the high-side driver for coil 14A. Similarly, power transistor 10 is the low-side driver for coil 14B. It is understood by persons skilled in the art that the circuitry necessary to run the DC motor is not shown in FIG. 1.

Under normal conditions, the current through the low-side driver is limited because of the impedance of the stator coils. However, stator coils can fail in a manner which short circuits node 13 to a high voltage. The problem addressed by this invention occurs in trying to protect the low side driver 10 from excessive current when pin 13 has been short-circuited to a high voltage.

FIG. 1 illustrates the prior art short circuit protection circuit for the low-side driver 10. In this circuit, a short circuit on node 13 will cause an excessive current through the drain-source channel of low-side driver 10 and through sense resistor 12. The excessive current will increase the voltage drop across sense resistor 12. When the voltage drop across sense resistor 12 exceeds the reference voltage Vref, the output of comparator 4 will change from a low voltage to a high voltage thereby turning on transistor 6. Consequently, current source 8 draws current from the gate of low side driver 10 since current source 8 is larger than current source 2. Thus, transistor 10 is turned off at a controlled slew defined by the difference between current source 2 and current source 8. The slew rate is designed to optimize the response time and yet maintain stability, as is known in the art. However, current source 8, by necessity to add stability to the circuit, slows down the response time of the short circuit protection circuit.

Therefore, it is an object of the invention to provide a stable short circuit protection circuit which has improved response time. It is another object of the invention to improve the response time of the short circuit protection circuit with out changing the stability of the circuit. This and other objects, features, and advantages of the invention will be apparent to those skilled in the art from the following detailed description of the invention, when read with the drawings and appended claims.

SUMMARY OF THE INVENTION

The invention can be summarized as a short circuit protection circuit which has a first short circuit protection circuit in parallel with a second short circuit protection circuit. The first short circuit protection circuit includes a sense resistor and a comparator for detecting the short circuit, and a transistor and current source for turning off the low side driver when the short circuit is detected. The second short circuit protection circuit includes a current mirror, zener diode, transistor, and current source connected in series. The second short circuit protection circuit is in parallel with the first short circuit protection circuit. The second short circuit protection circuit accelerates the turn-off of the low-side driver with out affecting the stability of the circuit.

DETAILED DESCRIPTION OF THE PREFERRED EMBODIMENT

Figure 1:
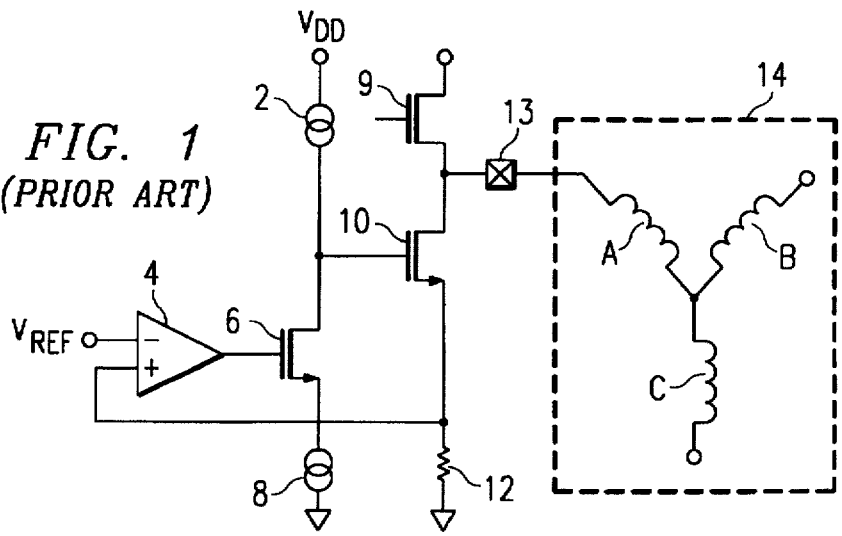
FIG. 1 is a low-side driver circuit with short circuit protection, s is known in the prior art.
Figure 2:
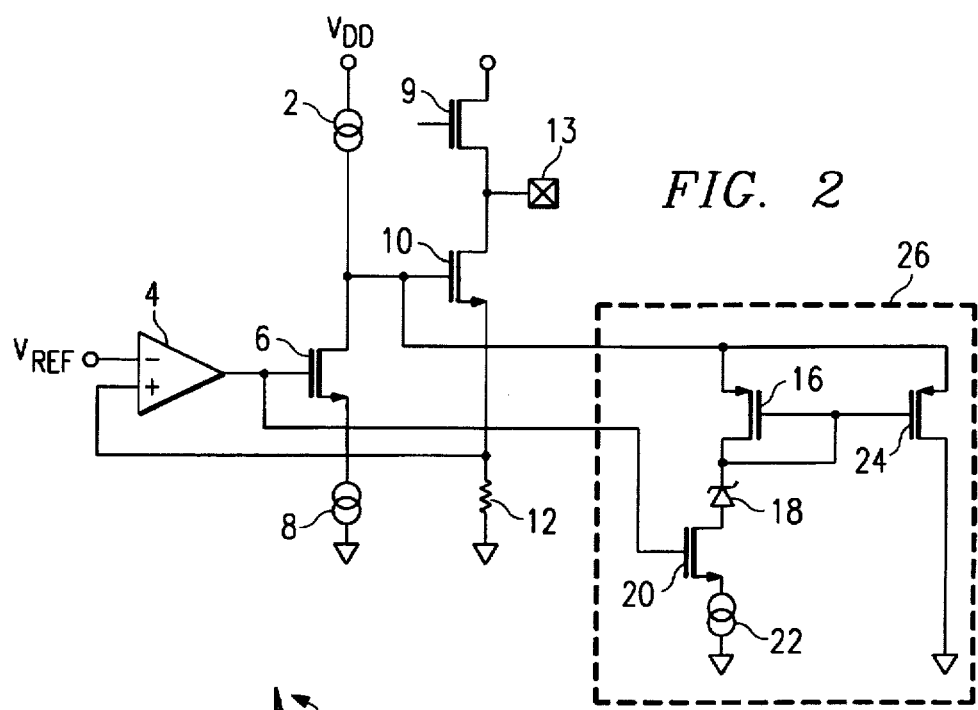
FIG. 2 is a low-side driver circuit with the preferred embodiment short circuit protection circuit.

A short circuit protection circuit constructed according to the preferred embodiment of the invention will now be described. Referring to FIG. 2, the short circuit protection circuit is made from a first short circuit protection circuit which is in parallel to a second short circuit protection circuit 26. In this figure, transistor 9 is a high-side driver and transistor 10 is the low-side driver.

The first short circuit protection circuit is constructed by connecting a first end of current source 2 to a Vdd voltage. The second end of current source 2 is connected to the gate of N-channel low-side driver 10 and to the drain of N-channel transistor 6. The source of low-side driver 10 is connected to a first end of sense resistor 12. The second end of sense resistor 12 is connected to ground. Comparator 4 has an inverting input connected to a reference voltage Vref and a noninverting input connected to the first end of sense resistor 12. The output of comparator 4 is connected to the gate of transistor 6. The source of transistor 6 is connected to the first end of current source 8. The second end of current source 8 is connected to ground.

The second short circuit protection circuit includes a current mirror (made from transistors 16 and 24), a Zener diode 18, an N-channel transistor 20, a current source 22, all connected in series. The second short circuit protection circuit is constructed by connecting the source of P-channel transistor 16 to the source of P-channel transistor 24 and to the gate of low-side driver 10. The drain of transistor 24 is connected to ground. The gate of transistor 24 is connected to the gate and drain of transistor 16 and to the cathode of Zener diode 18. The anode of diode 18 is connected to the drain of N-channel transistor 20. The gate of transistor 20 is connected to the output of comparator 4. The source of transistor 20 is connected to a first end of current source 22 whose second end is connected to ground.

In operation, the first and second short circuit protection circuits are designed to protect low-side driver 10 in the event of a short circuit condition. When node 13 is short circuited to a high voltage, an excessive amount of current will surge through low-side driver 10 and, therefore, through sense resistor 12. The surge in current through sense resistor 12 will induce a positive voltage proportional to the current surge. This voltage is sensed on the inverting input of comparator 4. When the voltage on sense resistor 12 exceeds the reference voltage Vref, the comparator will switch from a low voltage to a high voltage on the output thereby turning on transistor 6. This allows current 8 to discharge the gate of low-side driver 10 since current source 8 is larger than the current source 2. Additionally, transistor 20 in the second short circuit protection circuit 26 also turns on. By turning transistor 20 on, current source 22 activates current mirror created with transistors 16 and 24 through diode 18 such that additional current is drawn from the gate of low side driver 10. Current source 22 and the current mirror are design such that the current drawn through the current mirror is approximately 5-10 times larger than the current drawn through transistor 6 and current source 8.

In the preferred embodiment, the second short circuit protection circuit uses a 6 volt zener diode. The circuit sinks through the primary side of the current mirror the same current as through current source 8 and eight times more through the mirrored side of the current mirror. Using these values, the second short circuit protection circuit increases the turn-off of low-side driver transistor until the short circuit current is reduced to around 7 amps.

Figure 3:
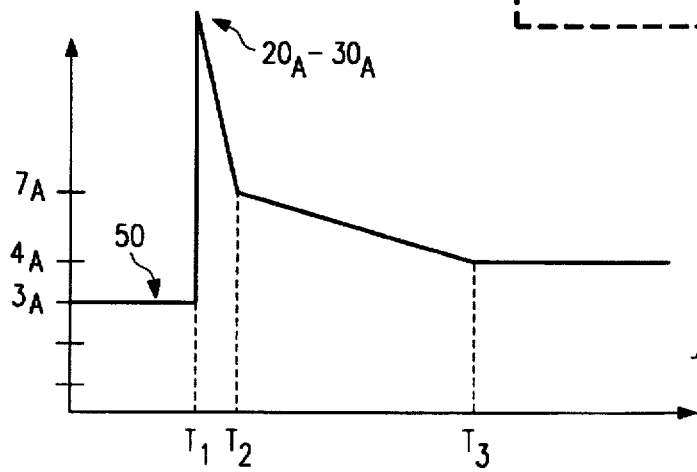
FIG. 3 is a graphical simulation of the current going through the low-side driver of the low-side driver circuit of FIG. 2.

FIG. 3 shows the effect of having this second short circuit protection circuit in place. Waveform 50 shows the current going through low-side driver 10. From time 0 to $t_1$ the waveform shows 3 amps going through the low-side driver which would be typical for this embodiment. At $t_1$ the current waveform 50 increases to approximately 20-30 amps because of a short circuit condition. The time between $t_1$ and $t_2$ shows a rapid decrease in the current through low-side driver 10 due to the fact that the gate of low-side driver is being turned off by the first short circuit protection circuit and the second short circuit protection circuit. When the gate of low-side driver falls below the voltage drop of the current mirror plus the Zener diode, the second short circuit protection circuit 26 turns off and no longer contributes to the protection of low-side driver 10. So, from $t_2$ until $t_3$ the first short circuit protection circuit continues to control low-side transistor 10 until the circuit stabilizes at approximately 4 amps which would be considered a safe current for low-side transistor 10.

By utilizing this second short circuit protection circuit, the low-side driver is exposed to the high short circuit current of 20-30 amps for a much shorter period of time since the slew rate of the turn off is increased by 5-10 times. This benefit is achieved without decreasing the stability of the first short circuit protection circuit since it is not active in the voltage ranges where the first short circuit protection circuit becomes linear. Therefore, the disclosed invention provides the benefit of increasing the short circuit protection without decreasing the stability of the circuit.

Although the invention has been described and illustrated with a certain degree of particularity, it is understood that the present discloser has been made only by way of example, and that numerous changes in the combination and arrangement of the parts can be resorted to by those skilled in the art without departing from the spirit and scope of the invention, as hereinafter claimed.

I claim:

1. A short circuit protection circuit for protecting a power transistor, the short circuit protection circuit comprising:
   a first short circuit protection circuit for turning off the power transistor comprising:
      a comparator having an inverting input coupled to a reference voltage, a noninverting input, and an output;
      a sense resistor having a first end and a second end, the sense resistor coupled in series with the power transistor wherein the noninverting input of the comparator is coupled to the sense resistor;
      a transistor having a first end, a second end, and a control element, the first end coupled to a control element of the power transistor and the control element coupled to the output of the comparator;
      a current source having a first end connected to the second end of the transistor and having a second end connected to a voltage reference;
   a second short circuit protection circuit comprising:
      an input coupled to the output of the comparator of the first short circuit protection circuit;
      an output coupled to the control element of the power transistor; and
      means for accelerating the turn-off of the power transistor by the first short circuit protection circuit.

2. The short circuit protection circuit of claim 1 wherein said means for accelerating further comprises:
   a current mirror having a primary current path and a mirrored current path wherein the mirrored current path is coupled between the control element of power transistor and the voltage reference;
   a zener diode having a cathode connected in series with the primary current path of the current mirror and having an anode;
   a transistor having a current path with a first end coupled to the anode of the zener diode and with a second end, and having a control element coupled to the comparator; and
   a current source having a first end coupled to the second end of the current path of the transistor and having a second end connected to the voltage reference.

3. The short circuit protection circuit of claim 2 wherein the current mirror is comprised of two MOSFET transistors coupled in a gate to gate configuration.

4. The short circuit protection circuit of claim 3 wherein the two MOSFET transistors comprise two P-channel MOSFET transistors.

5. The short circuit protection circuit of claim 2 wherein the transistor comprises a MOSFET transistor.

6. The short circuit protection circuit of claim 5 wherein the MOSFET transistor comprises an N-channel MOSFET.

7. A short circuit protection circuit for protecting a power transistor, the short circuit protection circuit comprising:
   a first short circuit protection circuit for turning off the power transistor comprising:
      a comparator having an inverting input coupled to a reference voltage, a noninverting input, and an output;
      a sense resistor having a first end and a second end, the sense resistor coupled in series with the power transistor wherein the noninverting input of the comparator is coupled to the sense resistor;
      a transistor having a first end, a second end, and a control element, the first end coupled to a control element of the power transistor and the control element coupled to the output of the comparator;
      a current source having a first end connected to the second end of the transistor and having a second end connected to a voltage reference;
   a means for providing second short circuit protection circuit having an input coupled to the output of the comparator of the first short circuit protection circuit and having an output coupled to the control element of the power transistor, said means for providing including means for accelerating the turn-off of the power transistor by the first short circuit protection circuit.

8. The short circuit protection circuit of claim 7 wherein the means for providing the second short circuit protection circuit further comprises:

a current mirror having a primary current path and a mirrored current path wherein the mirrored current path is coupled between the control element of power transistor and the voltage reference;

a zener diode having a cathode connected in series with the primary current path of the current mirror and having an anode;

a transistor having a current path with a first end coupled to the anode of the zener diode and with a second end, and having a control element coupled to the comparator; and a current source having a first end coupled to the second end of the current path of the transistor and having a second end connected to the voltage reference.

9. The short circuit protection circuit of claim 8 wherein the current mirror is comprised of two MOSFET transistors coupled in a gate to gate configuration.

10. The short circuit protection circuit of claim 9 wherein the two MOSFET transistors comprise two P-channel MOSFET transistors.

11. The short circuit protection circuit of claim 8 wherein the transistor comprises a MOSFET transistor.

12. The short circuit protection circuit of claim 11 wherein the MOSFET transistor comprises an N-channel MOSFET.

13. A system for driving an inductive load comprising:

a high side transistor having a current path between a voltage source and the inductive load;

a lowside transistor having a current path with a first end connected to the inductive load and a second end, and having a control element;

a first short circuit protection circuit for turning off the lowside transistor comprising:

a comparator having an inverting input coupled to a reference voltage, a noninverting input, and an output;

a sense resistor having a first end and a second end, the sense resistor coupled in series with the low side transistor wherein the noninverting input of the comparator is coupled to the sense resistor;

a clamping transistor having a first end, a second end, and a control element, the first end coupled to a control element of the lowside transistor and the control element coupled to the output of the comparator;

a current source having a first end connected to the second end of the clamping transistor and having a second end connected to a voltage reference; and a second short circuit protection circuit comprising:

an input coupled to the output of the comparator of the first short circuit protection circuit;

an output coupled to the control element of the lowside transistor; and means for accelerating the turn-off of the lowside transistor by the first short circuit protection circuit.

14. The short circuit protection circuit of claim 13 wherein said means for accelerating further comprises:

a current mirror having a primary current path and a mirrored current path wherein the mirrored current path is coupled between the control element of the lowside transistor and the voltage reference;

a zener diode having a cathode connected in series with the primary current path of the current mirror and having an anode;

a transistor having a current path with a first end coupled to the anode of the zener diode and with a second end, and having a control element coupled to the comparator; and a current source having a first end coupled to the second end of the current path of the transistor and having a second end connected to the voltage reference.

15. The short circuit protection circuit of claim 14 wherein the current mirror is comprised of two MOSFET transistors coupled in a gate to gate configuration.

16. The short circuit protection circuit of claim 15 wherein the two MOSFET transistors comprise two P-channel MOSFET transistors.

17. The short circuit protection circuit of claim 14 wherein the transistor comprises a MOSFET transistor.

18. The short circuit protection circuit of claim 17 wherein the MOSFET transistor comprises an N-channel MOSFET.

19. A method for providing short circuit protection to a lowside transistor comprising the steps of:

comparing a voltage drop across a sense resistor to a reference voltage to determine if the lowside driver has been short circuited;

turning off the lowside driver using a first short circuit protection circuit responsive to a short circuit being detected; and accelerating turn-off of the lowside driver by the first short circuit protection circuit by using a second short circuit protection circuit.

20. The method of claim 19 wherein the second short circuit protection circuit comprises:

a current mirror having a primary current path and a mirrored current path wherein the mirrored current path is coupled between the control element of power transistor and the voltage reference;

a zener diode having a cathode connected in series with the primary current path of the current mirror and having an anode;

a transistor having a current path with a first end coupled to the anode of the zener diode and with a second end, and having a control element coupled to the comparator; and a current source having a first end coupled to the second end of the current path of the transistor and having a second end connected to the voltage reference.

* * * * *